United States Patent
Nguyen

(10) Patent No.: US 6,673,434 B2
(45) Date of Patent: Jan. 6, 2004

(54) THERMAL INTERFACE MATERIALS

(75) Inventor: My Nguyen, Poway, CA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/047,617

(22) Filed: Jan. 14, 2002

(65) Prior Publication Data

US 2002/0132896 A1 Sep. 19, 2002

Related U.S. Application Data

(63) Continuation-in-part of application No. 09/452,483, filed on Dec. 1, 1999, now Pat. No. 6,451,422.

(51) Int. Cl.$^7$ ................................................ B32B 5/16
(52) U.S. Cl. ...................... 428/323; 428/325; 428/328; 428/330; 428/492; 442/336; 442/367; 442/374; 442/375; 106/270; 106/272; 106/638; 106/640; 106/641; 106/660; 252/500; 252/512; 252/514; 252/519.3; 252/519.31; 252/519.33; 252/520.2
(58) Field of Search ................................. 428/323, 325, 428/328, 330, 492; 442/336, 367, 374, 375; 106/270, 272, 638, 640, 641, 660; 252/500, 512, 514, 519.3, 519.31, 519.33, 520.2

(56) References Cited

U.S. PATENT DOCUMENTS

| | | |
|---|---|---|
| 5,194,480 A | 3/1993 | Block et al. ................. 524/404 |
| 5,989,459 A | 11/1999 | Nguyen et al. .............. 252/503 |
| 6,238,596 B1 | 5/2001 | Nguyen et al. .............. 252/502 |
| 6,451,422 B1 | 9/2002 | Nguyen et al. .............. 428/323 |

OTHER PUBLICATIONS

M. Eaton "Differential Phase Change Thermal Interface Materials" pp. 1–9, May 1998.*
PCT International Search Report dated May 28, 2003.
Manford Eaton, entitled "Differential Phase Change Thermal Interface Materials" dated May 1998, pp. 1–9.

* cited by examiner

Primary Examiner—Leszek Kiliman
(74) Attorney, Agent, or Firm—Sandra P. Thompson; Dingham McCutchen

(57) ABSTRACT

A crosslinkable thermal interface material is produced by combining at least one rubber compound, at least one amine resin and at least one thermally conductive filler. This interface material takes on the form of a liquid or "soft gel". The gel state is brought about through a crosslinking reaction between the at least one rubber compound composition and the at least one amine resin composition. Once the foundation composition that comprises at least one rubber compound, at least one amine resin, and at least one thermally conductive filler has been prepared, the composition must be compared to the needs of the electronic component, vendor, or electronic product to determine if a phase change material is needed to change some of the physical properties of the composition. A method for forming the crosslinkable thermal interface materials disclosed herein comprises a) providing at least one saturated rubber compound, b) providing at least one amine resin, c) crosslinking the at least one saturated rubber compound and the at least one amine resin to form a crosslinked rubber-resin mixture, d) adding at least one thermally conductive filler to the crosslinked rubber-resin mixture, and e) adding a wetting agent to the crosslinked rubber-resin mixture. This method can also further comprise adding at least one phase change material to the crosslinked rubber-resin mixture. The contemplated thermal interface material can be provided as a dispensable liquid paste, a gel, a tape, or a film. Applications of the contemplated thermal interface materials described herein comprise incorporating the materials into a layered material, an electronic component or a finished electronic product.

33 Claims, No Drawings

THERMAL INTERFACE MATERIALS

This application is a continuation in part and claims the benefit of U.S. Utility application Ser. No. 09/452,483 filed Dec. 1, 1999, now U.S. Pat. No. 6,451,422 which is incorporated herein by reference in its entirety.

FIELD OF THE INVENTION

The field of the invention is interface materials in electronic component and layered materials applications.

BACKGROUND OF THE INVENTION

Electronic components are used in ever increasing numbers of consumer and commercial electronic products. Examples of some of these consumer and commercial products are televisions, personal computers, internet servers, cell phones, pagers, palm-type organizers, portable radios, car stereos, or remote controls. As the demand for these consumer and commercial electronics increases, there is also a demand for those same products to become smaller, more functional, and more portable for consumers and businesses.

As a result of the size decrease in these products, the components that comprise the products must also become smaller. Examples of some of those components that need to be reduced in size or scaled down are printed circuit or wiring boards, resistors, wiring, keyboards, touch pads, and chip packaging.

Components, therefore, are being broken down and investigated to determine if there are better building materials and methods that will allow them to be scaled down to accommodate the demands for smaller electronic components. In layered components, one goal appears to be decreasing the number of the layers while at the same time increasing the functionality and durability of the remaining layers. This task can be difficult, however, given that several of the layers and components of the layers should generally be present in order to operate the device.

Also, as electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. Most common types of thermal interface materials are thermal greases, phase change materials, and elastomer tapes. Thermal greases or phase change materials have lower thermal resistance than elastomer tape because of the ability to be spread in very thin layers and provide intimate contact between adjacent surfaces. Typical thermal impedance values range between 0.6–1.6° C. cm$^2$/w. However, a serious drawback of thermal grease is that thermal performance deteriorates significantly after thermal cycling, such as from 65° C. to 150° C., or after power cycling when used in VLSI chips. It has also been found that the performance of these materials deteriorates when large deviations from surface planarity causes gaps to form between the mating surfaces in the electronic devices or when large gaps between mating surfaces are present for other reasons, such as manufacturing tolerances, etc. When the heat transferability of these materials breaks down, the performance of the electronic device in which they are used is adversely affected.

Thus, there is a continuing need to: a) design and produce thermal interface materials and layered materials that meet customer specifications while minimizing the size of the device and number of layers; and b) develop reliable methods of producing desired thermal interface materials and layered materials and components comprising contemplated thermal interface and layered materials.

SUMMARY OF THE INVENTION

A contemplated crosslinkable thermal interface material is produced by combining at least one rubber compound, at least one amine resin and at least one thermally conductive filler. This contemplated interface material takes on the form of a liquid or "soft gel". The gel state is brought about through a crosslinking reaction between the at least one rubber compound composition and the at least one amine resin composition. More specifically, the amine resin is incorporated into the rubber composition to crosslink the primary hydroxyl groups on the rubber compounds thus forming the soft gel phase. Therefore, it is contemplated that at least some of the rubber compounds will comprise at least one terminal hydroxyl group.

Amine or amine-based resins are added or incorporated into the rubber composition or mixture of rubber compounds primarily to facilitate a crosslinking reaction between the amine resin and the primary or terminal hydroxyl groups on at least one of the rubber compounds. The crosslinking reaction between the amine resin and the rubber compounds leads to a "soft gel" phase to the mixture, instead of a liquid state.

Once the foundation composition that comprises at least one rubber compound, at least one amine resin, and at least one thermally conductive filler has been prepared, the composition must be compared to the needs of the electronic component, vendor, or electronic product to determine whether a phase change material is needed to change some of the physical properties of the composition.

Phase change materials are useful in thermal interface material applications because they store and release heat as they oscillate between solid and liquid form. A phase change material gives off heat as it changes to a solid state, and as it returns to a liquid, it absorbs heat. The phase change temperature is the melting temperature at which the heat absorption and rejection takes place.

A method for forming the crosslinkable thermal interface materials disclosed herein comprises a) providing at least one saturated rubber compound, b) providing at least one amine resin, c) crosslinking the at least one saturated rubber compound and the at least one amine resin to form a crosslinked rubber-resin mixture, d) adding at least one thermally conductive filler to the crosslinked rubber-resin mixture, and e) adding a wetting agent to the crosslinked rubber-resin mixture. This method can also further comprise adding at least one phase change material to the crosslinked rubber-resin mixture.

The contemplated thermal interface material can be provided as a dispensable liquid paste to be applied by dispensing methods and then cured as desired. It can also be provided as a highly compliant, cured, elastomer film or sheet for pre-application on interface surfaces, such as heat sinks. It can further be provided and produced as a soft gel or liquid that can be applied to surfaces by any suitable dispensing method. Even further, the material can be provided as a tape that can be applied directly to interface surfaces or electronic components.

Applications of the contemplated thermal interface materials described herein comprise incorporating the materials into a layered material, an electronic component or a finished electronic product.

Various objects, features, aspects and advantages of the present invention will become more apparent from the following detailed description of preferred embodiments of the invention.

DETAILED DESCRIPTION

A contemplated crosslinkable thermal interface material is produced by combining at least one rubber compound, at least one amine resin and at least one thermally conductive filler. This contemplated interface material takes on the form of a liquid or "soft gel". As used herein, "soft gel" means a colloid in which the disperse phase has combined with the continuous phase to form a viscous "jelly-like" product. The gel state is brought about through a crosslinking reaction between the at least one rubber compound composition and the at least one amine resin composition. More specifically, the amine resin is incorporated into the rubber composition to crosslink the primary hydroxyl groups on the rubber compounds, thus forming the soft gel phase. Therefore, it is contemplated that at least some of the rubber compounds will comprise at least one terminal hydroxyl group. As used herein, the phrase "primary hydroxyl groups" means that the hydroxyl groups are in the terminal position on the molecule or compound. The rubber compounds may also comprise additional secondary, tertiary, or otherwise internal hydroxyl groups that could also undergo a crosslinking reaction with the amine resin. This additional crosslinking may be desirable depending on the final gel state needed for the product or component in which the gel is to be incorporated.

It is contemplated that the rubber compounds could be "self-crosslinkable" in that they could crosslink intermolecularly with other rubber compounds or intramolecularly with themselves, depending on the other components of the composition. It is also contemplated that the rubber compounds could be crosslinked by the amine resin compounds and also perform some self-crosslinking activity with themselves or other rubber compounds.

In preferred embodiments, the rubber compositions or compounds utilized can be either saturated or unsaturated. Saturated rubber compounds are preferred in this application because they are less sensitive to thermal oxidation degradation. Examples of saturated rubbers that may be used are ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene. However, if the compound is unsaturated, it is most preferred that the compound undergo a hydrogenation process to rupture or remove at least some of the double bonds. As used herein, the phrase "hydrogenation process" means that an unsaturated organic compound is reacted with hydrogen by either a direct addition of hydrogen to some or all of the double bonds, resulting in a saturated product (addition hydrogenation), or by rupturing the double bond entirely, whereby the fragments further react with hydrogen (hydrogenolysis). Examples of unsaturated rubbers and rubber compounds are polybutadiene, polyisoprene, polystyrene-butadiene and other unsaturated rubbers, rubber compounds or mixtures/combinations of rubber compounds.

As used herein, the term "compliant" encompasses the property of a material that is yielding and formable at room temperature, as opposed to solid and unyielding at room temperature. As used herein, the term "crosslinkable" refers to those materials or compounds that are not yet crosslinked.

More than one rubber of each type may be combined to produce a crosslinkable thermal interface material; however, it is contemplated that in the preferred thermal interface material, at least one of the rubber compounds or components will be a saturated compound. Olefin-containing or unsaturated interface materials, with appropriate thermal fillers, exhibit a thermal capability of less than 0.5 $cm^{2o}$ C./w. Unlike thermal grease, thermal performance of the material will not degrade after thermal cycling or flow cycling in IC devices because liquid olefins and liquid olefin mixtures (such as those comprising amine resins) will crosslink to form a soft gel upon heat activation. Moreover, when applied as an interface material, it will not be "squeezed out" as thermal grease does in use and will not display interfacial delamination during thermal cycling.

Amine or amine-based resins are added or incorporated into the rubber composition or mixture of rubber compounds primarily to facilitate a crosslinking reaction between the amine resin and the primary or terminal hydroxyl groups on at least one of the rubber compounds. The crosslinking reaction between the amine resin and the rubber compounds produces a "soft gel" phase in the mixture, instead of a liquid state. The degree of crosslinking between the amine resin and the rubber composition and/or between the rubber compounds themselves will determine the consistency of the soft gel. For example, if the amine resin and the rubber compounds undergo a minimal amount of crosslinking (10% of the sites available for crosslinking are actually used in the crosslinking reaction) then the soft gel will be more "liquid-like". However, if the amine resin and the rubber compounds undergo a significant amount of crosslinking (40–60% of the sites available for crosslinking are actually used in the crosslinking reaction and possibly there is a measurable degree of intermolecular or intramolecular crosslinking between the rubber compounds themselves) then the gel would become thicker and more "solid-like".

Amine and amino resins are those resins that comprise at least one amine substituent group on any part of the resin backbone. Amine and amino resins are also synthetic resins derived from the reaction of urea, thiourea, melamine or allied compounds with aldehydes, particularly formaldehyde. Typical and contemplated amine resins are primary amine resins, secondary amine resins, tertiary amine resins, glycidyl amine epoxy resins, alkoxybenzyl amine resins, epoxy amine resins, melamine resins, alkylated melamine resins, and melamine-acrylic resins. Melamine resins are particularly useful and preferred in several contemplated embodiments described herein because a) they are ring-based compounds, whereby the ring contains three carbon and three nitrogen atoms, b) they can combine easily with other compounds and molecules through condensation reactions, c) they can react with other molecules and compounds to facilitate chain growth and crosslinking, d) they are more water resistant and heat resistant than urea resins, e) they can be used as water-soluble syrups or as insoluble powders dispersible in water, and f) they have high melting points (greater than 325° C. and are relatively non-flammable). Alkylated melamine resins, such as butylated melamine resins, are formed by incorporating alkyl alcohols during the resin formation. They are soluble in paint and enamel solvents and in surface coatings.

Thermal filler particles to be dispersed in the thermal interface material or mixture should advantageously have a high thermal conductivity. Suitable filler materials include metals, such as silver, copper, aluminum, and alloys thereof, and other compounds, such as boron nitride, aluminum nitride, silver coated copper, silver coated aluminum and carbon fibers. Combinations of boron nitride and silver or boron nitride and silver/copper also provide enhanced thermal conductivity. Boron nitride in amounts of at least 20 wt % and silver in amounts of at least about 60 wt % are particularly useful. Preferably, fillers with a thermal conductivity of greater than about 20 and most preferably at least about 40 w/m° C. will be used. Optimally, it is desired to have a filler of not less than about 80 w/m° C. thermal conductivity.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites. As used herein, the term "compound" means a substance with constant composition that can be broken down into elements by chemical processes.

Of special efficacy is a filler comprising a particular form of carbon fiber referred to as "vapor grown carbon fiber" (VGCF) such as is available from Applied Sciences, Inc., Cedarville, Ohio. VGCF, or "carbon micro fibers", are highly graphized types by heat treatment (thermal conductivity=1900 w/m° C.). Addition of about 0.5 wt. % carbon micro fibers provides significantly increased thermal conductivity. Such fibers are available in varying lengths and diameters; namely, 1 millimeter (mm) to tens of centimeters (cm) length and from under 0.1 to over 100 $\mu$m in diameter. One useful form of VGCF has a diameter of not greater than about 1 $\mu$m and a length of about 50 to 100 $\mu$m, and possess a thermal conductivity of about two or three times greater than with other common carbon fibers having diameters greater than 5 $\mu$m.

It is difficult to incorporate large amounts of VGCF in polymer systems and interface systems, such as the hydrogenated rubber and resin combination already discussed. When carbon microfibers, e.g. (about 1 $\mu$m, or less) are added to the polymer they do not mix well, primarily because a large amount of fiber must be added to the polymer to obtain any significant beneficial improvement in thermal conductivity. However, we have found that relatively large amounts of carbon microfibers can be added to polymer systems that have relatively large amounts of other conventional fillers. A greater amount of carbon microfibers can be added to the polymer when added with other fibers, which can be added alone to the polymer, thus providing a greater benefit with respect to improving thermal conductivity of the thermal interface material. Desirably, the ratio of carbon microfibers to polymer is in the range of 0.05 to 0.50 by weight.

Once the foundation composition that comprises at least one rubber compound, at least one amine resin, and at least one thermally conductive filler has been prepared, the composition must be compared to the needs of the electronic component, vendor, or electronic product to determine if an additional phase change material is needed to change some of the physical properties of the composition. Specifically, if the needs of the component or product require that the composition or interface material be in a "soft gel" form or a somewhat liquid form, then an additional phase change material may not need to be added. However, if the component, layered material or product requires that the composition or material be more like a solid, then at least one phase change material should be added.

Phase-change materials that are contemplated herein comprise waxes, polymer waxes or mixtures thereof, such as paraffin wax. Paraffin waxes are a mixture of solid hydrocarbons having the general formula $C_nH_{2n+2}$ and having melting points in the range of about 20° C. to 100° C. Polymer waxes are typically polyethylene waxes, polypropylene waxes, and have a range of melting points from about 40° C. to 160° C.

Phase change materials are useful in thermal interface material applications because they store and release heat as they oscillate between solid and liquid form. As a phase change material changes to a solid state, it gives off heat. As it returns to a liquid, it absorbs heat. The phase change temperature is the melting temperature at which the heat absorption and rejection takes place.

Paraffin-based phase change materials, however, have several drawbacks. On their own, they can be very fragile and difficult to handle. They also tend to squeeze out of a gap from the device in which they are applied during thermal cycling, very much like grease. The rubber-resin modified paraffin polymer wax system in accordance with the invention avoids these problems and provides significantly improved ease of handling, is capable of being produced in flexible tape or solid layer form, and does not pump out or exude under pressure. Although the rubber-resin-wax mixtures may have the same or nearly the same temperature, their melt viscosity is much higher and they do not migrate easily. Moreover, the rubber-wax-resin mixture can be designed to be self-crosslinking which ensures elimination of the pump-out problem in certain applications. Examples of contemplated phase change materials are malenized paraffin wax, polyethylene-maleic anhydride wax, and polypropylene-maleic anhydride wax. The rubber-resin-wax mixtures will functionally form at a temperature between about 50 to 150° C. to form a crosslinked rubber-resin network.

It is also advantageous to incorporate additional fillers, substances or particles, such as filler particles, wetting agents or antioxidants. Substantially spherical filler particles can be added to the interface mixture to maximize packing density. Additionally, substantially spherical shapes or the like will provide some control of the thickness during compaction. Typical particle sizes useful for fillers in the rubber material may be in the range of about 1–20 $\mu$m with a maximum of about 100 $\mu$m.

Dispersion of filler particles can be facilitated by addition of functional organometallic coupling agents or "wetting" agents, such as organosilane, organotitanate, organozirconium, etc. Organotitanate acts a wetting enhancer to reduce paste viscosity and to increase filler loading. An organotitanate that can be used is isopropyl triisostearyl titanate. The general structure of organotitanate is RO—Ti(OXRY) where RO is a hydrolyzable group, and X and Y are binder functional groups.

Antioxidants may also be added to inhibit oxidation and thermal degradation of the cured rubber gel or solid composition. Typical useful antioxidants include Irganox 1076, a phenol type or Irganox 565, an amine type, (at 0.01% to about 1 wt. %), available from Ciba Giegy of Hawthorne, N.Y. Typical cure accelerators include tertiary amines such as didecylanethylamine, (at 50 ppm—0.5 wt. %).

At least one catalyst may also be added to the thermal interface material or composition in order to promote a crosslinking or chain reaction between the at least one rubber compound, the at least one amine resin, the at least one phase change material, or all three. As used herein, the term "catalyst" means that substance or condition that notably affects the rate of a chemical reaction without itself being consumed or undergoing a chemical change. Catalysts may be inorganic, organic, or a combination of organic groups and metal halides. Although they are not substances, light and heat can also act as catalysts. In contemplated embodiments, the catalyst is an acid. In preferred embodiments, the catalyst is an organic acid, such as carboxylic, acetic, formic, benzoic, salicylic, dicarboxylic, oxalic, phthalic, sebacic, adipic, oleic, palmitic, stearic, phenylstearic, amino acids and sulfonic acid.

A method for forming the crosslinkable thermal interface materials disclosed herein comprises a) providing at least one saturated rubber compound, b) providing at least one amine resin, c) crosslinking the at least one saturated rubber compound and the at least one amine resin to form a crosslinked rubber-resin mixture, d) adding at least one thermally conductive filler to the crosslinked rubber-resin mixture, and e) adding a wetting agent to the crosslinked rubber-resin mixture. This method can also further comprise adding at least one phase change material to the crosslinked rubber-resin mixture. As discussed herein, liquid and solid thermal interface mixtures, materials and compositions can be formed using the contemplated method, along with tapes, electronic components, layered materials and electronic products.

The contemplated thermal interface material can be provided as a dispensable liquid paste to be applied by dispensing methods and then cured as desired. It can also be provided as a highly compliant, cured, elastomer film or sheet for pre-application on interface surfaces, such as heat sinks. It can further be provided and produced as a soft gel or liquid that can be applied to surfaces by any suitable dispensing method. Even further, the material can be provided as a tape that can be applied directly to interface surfaces or electronic components.

Applications of the contemplated thermal interface materials described herein comprise incorporating the materials into a layered material, an electronic component or a finished electronic product. Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up/mock-up. A prototype may or may not contain all of the actual components intended in a finished product, and a prototype may have some components that are constructed out of composite material in order to negate their initial effects on other components while being initially tested.

To illustrate the invention, a number of examples were prepared by mixing the components described in Examples A through F. As indicated in the tables, the properties of the compositions including viscosity, product form, thermal impedance, modulus of elasticity, and thermal conductivity are also reported.

The examples shown include one or more of the optional additions, e.g., antioxidant, wetability enhancer, curing accelerators, viscosity reducing agents and crosslinking aids. The amounts of such additions may vary but, generally, they may be usefully present in the following approximate amounts (in wt. %): filler up to 95% of total (filler plus rubbers); wetability enhancer 0.1 to 1% (of total); antioxidant 0.01 to 1% (of total); curing accelerator 50 ppm—0.5% (of total); viscosity reducing agents 0.2–15%; and crosslinking aids 0.1–2%. It should be noted the addition at least about 0.5% carbon fiber significantly increases thermal conductivity.

| Composition (by wt %) | A | B | C | D | E | F |
|---|---|---|---|---|---|---|
| Hydrogenated polybutylene mono-ol | 7.5 | 6.3 | 10 | 11.33 | 5 | 18 |
| Hydrogenated polybutadiene diol | none | none | 2 | none | none | none |
| Paraffin Wax | 3.1 | 2.2 | none | none | none | none |
| Butylated melamine resin | 1.7 | 0.4 | 1.33 | 2 | 1 | 4 |
| Organotitanate | 1.5 | 1.0 | 6.67 | 6.67 | 4 | 8 |
| Sulfonic Acid Catalyst | 0.1 | none | none | none | none | none |
| Phenolic Antioxidant | 0.1 | 0.1 | none | none | none | none |
| Aluminum powder | 86 | 90 | 80 | 80 | none | none |
| Silver Powder | none | none | none | none | 90 | none |
| Boron Nitride | none | none | none | none | none | 70 |
| Product Form | Tape | Tape | Liquid | Liquid | Liquid | Liquid |
| Thermal Impedance (° C. cm$^2$/w) | 0.25 | 0.18 | 0.25 | 0.25 | 0.3 | 0.35 |
| Thermal conductivity (w.m/° C.) | 3.0 | 5.0 | 2.8 | 2.8 | 2.3 | 2.0 |
| Modulus of Elasticity, Pa | 300000 | 270000 | 500000 | 300000 | 280000 | 270000 |
| Viscosity, Pa · s | N/A | N/A | 200 | 160 | 150 | 220 |

Thus, specific embodiments and applications of thermal interface materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A crosslinkable thermal interface material comprising at least one rubber compound, at least one amine resin and at least one thermally conductive filler.

2. The thermal interface material of claim 1, further comprising at least one phase change material.

3. The thermal interface material of claim 1, wherein the at least one rubber compound comprises at least one terminal hydroxy group.

4. The thermal interface material of claim 3, wherein the at least one rubber compound comprises at least one saturated compound.

5. The thermal interface material of claim 4, wherein the at least one rubber compound comprises hydrogenated polyalkyldiene mono-ol, hydrogenated polyalkyldiene diol, or a combination or mixture thereof.

6. The thermal interface material of claim 5, wherein the hydrogenated polyalkyldiene mono-ol comprises hydrogenated polybutadiene mono-ol.

7. The thermal interface material of claim 5, wherein the hydrogenated polyalkyldiene diol comprises hydrogenated polybutadiene diol.

8. The thermal interface material of claim 1, wherein the at least one amine resin comprises a melamine resin.

9. The thermal interface material of claim 8, wherein the melamine resin comprises an alkylated melamine resin.

10. The thermal interface material of claim 9, wherein the alkylated melamine resin comprises butylated melamine resin.

11. The thermal interface material of claim 1, wherein the at least one thermally conductive filler comprises a metal powder, a boron nitride compound or a combination or mixture thereof.

12. The thermal interface material of claim 11, wherein the metal powder comprises aluminum powder, silver powder, copper powder or a combination or mixture thereof.

13. The thermal interface material of claim 2, wherein the at least one phase change material comprises a wax.

14. The thermal interface material of claim 13, wherein the wax comprises a paraffin wax.

15. The thermal interface material of claim 1, further comprising at least one catalytic material.

16. The thermal interface material of claim 2, further comprising at least one catalytic material.

17. The thermal interface material of one of claim 15 or 16, wherein the at least one catalytic material comprise sulfonic acid catalyst.

18. The thermal interface material of one of claims 1 or 2, further comprising at least one wetting agent.

19. The thermal interface material of claim 18, wherein the wetting agent comprises organotitanate.

20. A layered component comprising the thermal interface material of claim 1.

21. An electronic component comprising the thermal interface material of claim 1.

22. A layered component comprising the thermal interface material of claim 2.

23. An electronic component comprising the thermal interface material of claim 2.

24. A liquid composition comprising the thermal interface material of claim 1.

25. A solid composition comprising the thermal interface material of claim 2.

26. A tape comprising the thermal interface material of claim 2.

27. A method of forming a crosslinkable thermal interface material, comprising:

providing at least one saturated rubber compound;

providing at least one amine resin;

crosslinking the at least one saturated rubber compound and the at least one amine resin to form a crosslinked rubber-resin mixture;

adding at least one thermally conductive filler to the crosslinked rubber-resin mixture; and adding a wetting agent to the crosslinked rubber-resin mixture.

28. The method of claim 27, further comprising adding at least one phase change material to the crosslinked rubber-resin mixture.

29. A liquid thermal interface composition formed by the method of claim 27.

30. A solid thermal interface composition formed by the method of claim 28.

31. A tape comprising the thermal interface composition of claim 30.

32. An electronic component comprising the thermal interface material of claim 29.

33. An electronic component comprising the thermal interface material of claim 30.

* * * * *